United States Patent [19]
Gleeson, III

[11] Patent Number: 5,159,209
[45] Date of Patent: Oct. 27, 1992

[54] CIRCUIT TO SELECTIVELY PROCESS DIP SWITCHES ONTO BUS LINES

[75] Inventor: William J. Gleeson, III, Tuscon, Ariz.

[73] Assignee: Artisoft, Inc., Tucson, Ariz.

[21] Appl. No.: 684,328

[22] Filed: Apr. 12, 1991

[51] Int. Cl.$^5$ ............................................. H03K 19/00
[52] U.S. Cl. .................................. 307/480; 307/465; 307/452
[58] Field of Search ...................... 307/480, 465, 452

[56] References Cited

U.S. PATENT DOCUMENTS

| | | | |
|---|---|---|---|
| 4,504,927 | 3/1985 | Callan | 364/900 |
| 4,630,198 | 12/1986 | I-Yuan | 364/200 |
| 4,725,836 | 2/1988 | Guidos | 340/825.590 |
| 4,749,825 | 6/1988 | Stewart | 178/4.1 A |
| 4,757,215 | 7/1988 | Seo | 307/452 |
| 4,906,870 | 7/1988 | Gongwer | 307/465 |

Primary Examiner—Eugene R. LaRoche
Assistant Examiner—R. A. Ratliff
Attorney, Agent, or Firm—J. Michael McClanahan

[57] ABSTRACT

A circuit to selectively process dip switches onto bus lines in a computer or device utilizing digital logic circuits wherein the dip switches are operably connected to a changeable source of digital signals so that upon command at desired times, the output of the dip switches connected to the bus lines may be reversed. Such a circuit consists of connecting the dip switches on one side to the bus lines and the other side through a current limiting resistor to the output of a logic circuit such as a NAND gate or other circuit which constantly outputs a digital signal. The input then to this logic circuit may be changed as desired to reverse the logic circuit output and thus the output of the dip switches. If desired, in place of the NAND gate output, the current limiting resistor may be grounded or connected to digital "1" in which case a constant digital signal is outputted to the bus lines upon dip switch closure.

13 Claims, 2 Drawing Sheets

CIRCUIT TO SELECTIVELY PROCESS DIP SWITCHES ONTO BUS LINES

BACKGROUND OF THE INVENTION

1. Field of the Invention

The field of the invention is circuits useful in computers and transistor logic wherein digital signals are sequentially time processed onto a common bus line for removal.

2. Description of the Related Art

It is quite common in computer and other transistor logic design to have common bus lines which, as the name implies, is used in routing signals throughout a computer or other device for internal or external processing of digital signals residing on these bus lines. It is apparent also that signals which are being placed onto the bus lines and being removed from the bus lines must be properly time oriented. Specific digital signals are placed onto the bus lines only at certain times at one point so that they may be taken off the bus lines simultaneously at a distant point whereupon the bus lines are then available to receive other digital signals also to be taken off the lines at later designated times.

Normally, the signals which are placed upon the bus lines will come from many sources, such as an internal memory device, a microprocessor, a disc controller, communication adapter or the like. The signals are then shunted around the computer to other components or may even be pulled off the bus lines for transmission to a distant machine, such as a printer or another computer. All the inputs and outputs are time related.

To place signals upon the bus lines, multiple elements may be attached to the same bus line, commonly integrated circuit type line drivers are utilized, as well as manually operated electrical switches, termed dip switches. These dip switches usually have one side connected to a bus line and the other side grounded.

The dip switch, when closed, will very effectively ground that particular bus line. This ground is also normally the digital signal "0". It is apparent that the side of the dip switch opposite the bus line could also be connected to a voltage representative of the digital signal "1", normally +5 volt dc. In this latter case, with the dip switch closed, a "1" would at all times appear on the bus line. However, if that +5 volts were hard wired to the source of power, potential problems develop if one of the integrated circuit type line drivers also connected to the bus line were to output a ground.

Therefore, typically the side of the dip switch placed to ground or to the digital "1" voltage has interposed a current limiting resistor so as to eliminate this problem. Then, once the dip switch is set to an on or off, i.e., closed or open position, that digital signal will reside on the bus line continually until changed or until a stronger signal comes onto the bus line such as to swamp the signal from the dip switch.

This is essentially the case with line drivers, in that the output of the line driver connected to a bus line has such a very low output impedance such that were the line driver to output a voltage different then the voltage placed on that same bus line by a connected dip switch, there would be current flow between the line driver and the source of voltage or ground operably attached to the dip switch. In these cases, the voltage difference between the source and the ground resides across that current limiting resistor situated between the dip switch and the source of voltage or ground. The line drivers are so fabricated to easily absorb or deliver the current flowing through the dip switch resistor and thus to drop all the voltage across that resistor so that the output voltage of the line driver will be the voltage residing on the bus line.

In addition, connected to the bus lines are inputs to a second, or output, line driver in order that this second line driver receives the signal outputs of the bus lines and sends them on their way as needed.

Typically, in addition to the signal input and output lines, line drivers have an input termed the enable input. When the enable input to a line driver is asserted, the line driver commences its operation and the digital "1" or "0" on each of the inputs is outputted from each of the corresponding output lines with added substantial current delivering or absorbing capacity. The output signal continues so long as there is an input signal and the enable signal is present. At the time that the line driver is enabled, the output impedance of the line driver is very low, regardless of whether the output is a +5 volts dc (digital "1"), or 0 volts (digital "0"). At all other times when the line driver is not operating (enabled), each of its outputs have a very high output impedance such that the line driver presents no current burden upon the bus line to which it is connected.

It is to this commonly available system of placing a pre-selected digital signal on the bus line through a manually set dip switch that the present invention is directed.

Accordingly, it would be useful to allow more flexibility in placing digital signals from manually set dip switches onto bus lines so that it may be done in accordance with chosen timing. In addition, it would be useful to provide flexibility in changing a signal through a closed dip switch. More particularly, It is to this system of providing means for selectively altering the signal a closed dip switch places onto a bus line in accordance with the requirements of circuits to which the subject invention is directed.

SUMMARY OF THE INVENTION

The embodiment of the invention described consists of circuitry which enables the placement onto a bus line at designated times a selected digital "0" or "1" electrical signal through manually set dip switches. To accomplish the above, each of the dip switches, which usually are two sided single pole single throw switches, have one side connected to the bus line. To the second side, which normally is directed to ground or to the voltage of a digital "1", is in the instant case connected a resistor and then onto the output of a NAND gate. The NAND gate always has a digital output, either a "0" or a "1", and may be pulsed at designated times to change either the "0" or "1" on one side of the dip switch. The dip switch, which is manually operated, if closed, then places the "0" or the "1" upon the bus line as determined by the output of the NAND gate. Merely by switching the digital signal input to the NAND gate, the output of the NAND gate is changed and the opposite digital signal is placed upon the bus line through the closed dip switch.

In the preferred embodiment, the two inputs to the NAND gate are wired together so that the NAND gate is operating as an inverter. In the ganged dip switches of the circuit, the same side of each switch is connected to one side of an associated current limiting resistor and then all of the other leads of the resistor are connected to the single output of the NAND gate. This resistor is normally of a value of 10K ohms.

Of course, since the dip switches have an open or a closed condition, only those switches within the ganged dip switches having the closed or completed connection place a digital signal upon the bus line.

Also connected to the bus lines are other elements which place digital signals at desired times upon the bus line. These include one or more line drivers with multiple outputs, each output connected to a different bus line. The line drivers receive input signals upon multiple inputs which are in turn placed upon individual bus lines through each of the line driver's outputs when each line driver is pulsed at its enable input by an enabling signal.

Receiving digital signals from each of the bus lines is another line driver, termed the output line driver, each line of the bus lines feeding one input into the output line driver. This output line driver, like the first line driver, also has an enabling input which, upon receiving the enable pulse, will output what is on the input.

In the circuit are additional biasing resistors, i.e., a single resistor attached at one end to each line of the bus lines. The other end of the resistor is attached to the source of digital "1", +5 volts dc. This biasing resistor, however, is of high value, normally 1 meg ohm, and is easily swamped by signals coming from a dip switch or signals coming from an output of a line driver.

It is further obvious that one might attach onto the bus lines a multiple of both dip switches and line drivers, all inputting onto the bus lines at specific times for the purpose of being picked off the bus lines at the same time by the output line driver which receives its inputs from the bus lines.

It is an object of the subject invention to provide a means by which selective digital signals may be ted onto bus lines through manually set dip switches.

It is another object of the subject invention to provide a means by which the signals exiting dip switches may be changed as the need arises within the related circuitry.

Other objects of the invention will in part be obvious and will in part appear hereinafter. The invention accordingly comprises the apparatus possessing the construction, combination of elements, and arrangement of parts which are exemplified in the following detailed disclosure and the scope of the application which will be indicated in the claims.

BRIEF DESCRIPTION OF THE DRAWINGS

For further understanding of the features and objects of the subject invention, reference should be had to the following detailed description taken in connection with the accompanying drawings wherein.

In various views, like index numbers refer to like elements.

DETAILED DESCRIPTION OF THE PREFERRED EMBODIMENT

Figure 1:
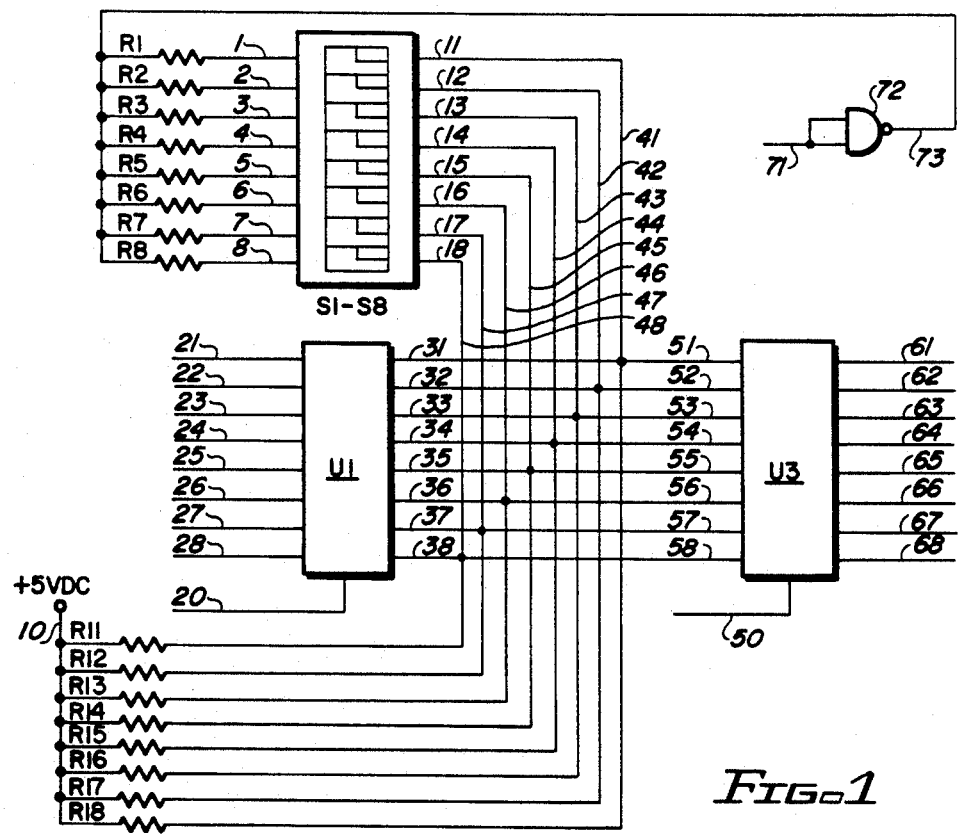
FIG. 1 is a modified block schematic diagram of the subject invention.

Referring now to FIG. 1, shown is a schematic block diagram of typical input line driver U1 which receives input signals from any one of a number of computer or other digital components, such as a memory device, microprocessor, disc controller, or communication adapter (none of which shown) for feeding digital signals onto the bus lines of a computer or other device at designated times. Such bus lines are shown as electrical lines 41-48.

Also attached to bus lines 41-48 are eight dip switches S1-S8 which are usually manually operated to place a set signal (either a digital "1" or "0") upon the bus line which will remain for all time when each of the switches are in closed position. Dip switches S1 through S8 are ganged single-pole, single-throw switches which have current limiting resistors tied to their connection point opposite their connection to the bus lines. The resistors are typically 10K ohms, here enumerated R1-R8. The other lead of each of the resistors is tied to the output of a digital logic element, such as NAND gate 72. Electrical line inputs 71 of NAND gate 72 are tied together as shown in FIG. 1 which causes the circuit to act as an inverter, and receive as their input a signal which prepares the dip switches for outputting a signal to the bus lines.

At the lower portion of FIG. 1, bus lines 41-48 are terminated through bias resistors to a voltage source having a value generally designating the digital "1" utilized in the computer, or other device, i.e., a source of constant digital signal, normally +5 volts dc. These bias resistors, typically 1 meg ohm, are more particularly designated R11-R18 and connect through lead 10 to the voltage source.

Input line driver U1 receives electrical signals on each of its plurality of inputs 21-28 and an enabling signal on line 20 shown in FIG. 1 entering module U1 at its bottom. When an electrical signal on line 20 is a digital "0" bit, or 0 volts, each individual signal on input lines 21-28 is then passed through line driver U1 to each of the output lines 31-38. The line driver output greatly increases the current output capacity of the signal. A "0" bit input to line driver U1, when enabled, then appears as a "0" bit output and 0 volts to ground. Conversely, a "1" bit input appears as a "1" bit output, +5 volts dc.

Line drivers have characteristics of a low output impedance when driving (enabled), be it either a "0" bit (0 volts) or a "1" bit (+5 volts dc). When not enabled and therefore not driving, there is no output and the output of the line driver is free to float since at that time it has such a high impedance it does not constitute an electrical burden upon the bus line. The line driver's input impedance is always high so as not to electrically drag down any unit supplying the input signal.

The characteristics of the NAND gate is that it has a low output impedance when it has either a "0" or "1" bit output and also has a high input impedance. A NAND gate always has an output.

Receiving signals from the bus lines is output line driver U3 which has the same input and output impedance characteristics as line driver U1, it outputting what is on each of the individual input lines 51-58 (connected respectively to bus lines 41-48) when a "0" bit is present on the enable line 50 entering the bottom of the line driver. Each of the outputs of line driver U3 on lines 61-68 are the signals that the computer or other device send to such elements as a distant printer, modem, another computer, etc, or for that matter, another component within the computer.

Characteristically, when the input signals to line driver U1 are desired to be read into line driver U3 (which in turn will be read out), firstly the signal on enable line 20 of line driver U1 changes from a digital "1" to a digital "0". When that happens, all eight outputs of U1 on lines 31-38 are simultaneously placed upon respective bus lines 41-48. This immediately places a very hard "1" or "0" (+5 volt DC or 0 volt) upon each of the respective bus lines, and regardless of the digital output of the dip switches S1-S8, when closed, whether their output is a digital "1" or "0", the output of line driver U1 will prevail. If the dip switch is open, it does not contribute either a "1" or "0".

If an output of U1 is +5 volt dc (digital "1") and the output of the connecting closed dip switch is 0 volts (digital "0") because the output of NAND gate 72 is "0", the particular current limiting resistor R1-R8, being typically 10K ohm, will carry a current of ½ ma. This drops the 5 volts across that resistor. The current supplied by line driver U1 is just a small fraction of the output current capability of the line driver. Thus, any difference in voltages between the output of NAND gate 72 (as reflected through each of the resistors R1-R8 and their respective connected dip switch) has no effect upon the high voltage (+5 volts dc) output of line driver U1.

Similarly, if the output of line driver U1 is a digital "0" or 0 volts, and since the output impedance of the line driver is so low, a +5 volt dc output from NAND gate 72 (through one of the resistors R1-R8 and respective connected dip switch) will result in a current of ½ ma flowing with all the voltage dropped across the resistor. There is a small voltage divider network between the resistor R1-R8 and the output impedance of line driver U1, however, since the output impedance of line driver U1 is just a few tenths of an ohm at the most, all the voltage drop is across the resistors R1-R8 and the bus line sees either 0 or +5 volts dc.

With respect to the lower end of bus lines 41-48, namely those ends terminated in bias resistors R11-R18, the same analogy is applied to the situation of outputs on line driver U1 as was the case of the dip switches S1-S8 and their connected resistors R1-R8. However, here the problem is even lessened since resistors R11-R18 are typically 1 meg ohm which means that their effect upon the bus lines, vis-a-vis the outputs of line driver U1, is not even measurable.

The input impedance to output line driver U3 is also very high, in the order of multiple meg ohms, so obviously it also will not constitute an electrical burden to any voltages residing on the bus lines.

The net effect thus is that the "1" or "0" digital signal to each of the inputs to line driver U1, when U1 is enabled, will be transferred on to the respective bus lines 41-48 without modification regardless of output of NAND gate 72 or the open or closed position of dip switches S1-S8.

Conversely, when line driver U1 is not enabled and output lines 31-38 are free to float, the digital signal on dip switches S1-S8 will rule when they are closed. For one of the switches of dip switches S1-S8 closed, then the hard output of NAND gate 72 is transferred through the particular resistor of current limiting resistors R1-R8 onto the respective line of bus lines 41-48.

If the dip switch is open, the only source of voltage onto the bus line then is the +5 volts or digital "1" placed there by the biasing of the particular resistor of resistors R11-R18. Even although these resistors are typically in the order of 1 meg ohm, a sufficiently hard signal is registered since a much higher input impedance to the input to line driver U3 exists, both when it is enabled or not enabled.

Thus, in order of priority, the outputs of line driver U1, when enabled, will prevail over output of the dip switches S1-S8 when closed and the +5 volts dc connected to biasing resistors R11-R18. In absence of outputs of line driver U1, the outputs of dip switches S1-S8, when closed, will prevail over the output of the biasing resistors R11-R18.

Figure 2:
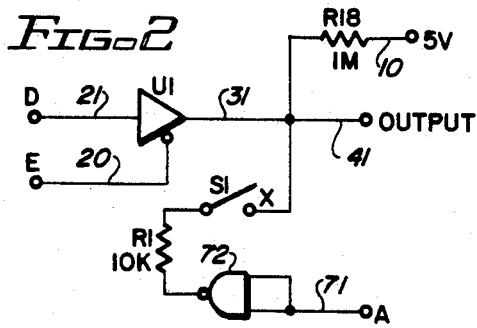
FIG. 2 is a simplified modified block schematic diagram of one bus line output and the elements connected to it.

In order to prepare a truth table for the outputs of the line driver U1 and the dip switches S1-S8, a simplified block schematic diagram such as shown in FIG. 2 may be constructed. Here, A is the input to NAND gate 72 on line 71 and the dip switch is represented by S1. Line driver U1 has an input D on line 21 and line 20 allows entrance of the enable signal E. The 1 meg ohm biasing resistor R18 connecting output bus line 41 to +5 volts is shown as is the 10K ohm current limiting resistor R1 between the NAND gate and the dip switch.

Recalling the conditions which were placed upon the various components of the elements of FIG. 1, the following truth table may be constructed. In the truth "0" or "1" represents 0 volts or +5 volts dc respectively.

TABLE 1

| | INPUTS (VOLTS) | | | | | | | |
|---|---|---|---|---|---|---|---|---|
| Switch S1 | E = | 0 | 0 | 0 | 0 | 5 | 5 | 5 | 5 |
| | D = | 0 | 0 | 5 | 5 | 0 | 0 | 5 | 5 |
| | A = | 0 | 5 | 0 | 5 | 0 | 5 | 0 | 5 |
| ⟋ //////// //////// | | 0 | 0 | 1 | 1 | 1 | 1 | 1 | 1 |
| ─── //////// //////// | | 0 | 0 | 1 | 1 | 1 | 0 | 1 | 0 |
| OUTPUTS (TTL) | | | | | | | | | |

In discussing the truth table shown in Table 1, along the first row, with dip switch S1 open, input A to NAND gate 72 has no effect whatever on the output, regardless of the status of input A. Therefore, the output is determined only by the output of line driver U1 and bias resistor R18 of 1 meg ohm connected to +5 volts.

So long as E is "0", which means that line driver U1 is being enabled, the output of line driver U1 reflects the input D. Therefore, with the input D being "0", the output is also "0" and, having low output impedance, output 41 of the circuit shown in FIG. 2 will be digital "0". The voltage drop between the +5 volt source and the output will all be across the 1 meg ohm resistor R18. Similarly, for the case of input D being "1" or +5 volts, the output of line driver U1 will also be +5 volts when E is "0" and therefore the output of the circuit will also be +5 volts or digital "1" as shown.

For the next case, when input signal E is digital "1", or +5 volts dc, line driver U1 is not enabled and its output is neither 0 volts nor +5 volts, but free floating, having no effect to whatever line it might be connected to. Since it has a high output impedance in this case, in the order of multiple meg ohms, it has no external effects upon other signals. Accordingly, with switch S1 open so that input A to NAND gate 72 has no effect, the output of the circuit shown in FIG. 2 will reflect +5 volts dc, a digital "1" due to bias resistor R18 connected to +5 volts dc. This results in the last four "1's" in the line corresponding to switch S1 being open.

Analyzing the second row, i.e., switch S1 being closed, input A to NAND gate 72 now begins to have an effect upon the output 41. For the first case, with the enabling input E being "0", and D being "0", the output of line driver U1 is a hard "0". With A being "0", after being processed through NAND gate 72, a "1" will appear on the output of the NAND gate. However, this "1" will not be transferred across 10K ohm resistor R1 since there is "0" on the output of line driver U1. The 10K resistor will, however, conduct current of ½ ma from NAND gate 72 to the output of line driver U1, a situation easily tolerated by line driver U1, and thus the +5 volts dc will all be across resistor R1. Similarly, the 1 meg ohm resistor R18 will also conduct a current of 5 microamps to the output of line driver U1 with the +5 volts dc across this resistor. In all cases, the output 41 will reflect the output of line driver U1, a digital "0".

For the second case, with switch S1 closed and input A being a "1" so that the output of NAND gate 72 is a "0", the output 41 remains the same "0" since the only element negatively affecting the output to attempt to change it from the output of line driver U1 is the 1 meg ohm bias resistor R18 connected to +5 volts dc. Resistor R18 will drop the +5 volts dc. Thus the output will again be "0" as shown in the truth table.

For the next two cases, when enabling input E is "0", and the input D is "1" or +5 volts, output 41 will also be "1" reflecting the output of line driver U1. This is so regardless of the input A since even if the input A is a "1" or +5 volts dc, the output of the NAND gate is a "0" or 0 volts dc, and all voltage drop between output 41 and the output of the NAND gate will be across 10K ohm resistor R1 (switch S1 closed) and the output will remain a "1" or +5 volt dc. Thus the two "1's" are reflected in the truth table for input D being +5 volts dc.

For the last four cases of closed switch S1 and input E being "1" or +5 volts dc, line driver U1 will have no output for any input D. With the output of line driver U1 free to float, the output of the circuit on line 41 will be determined by either input A and/or 1 meg ohm resistor R18 connected to +5 volts dc.

For input A being "0", the output of NAND gate 72 is "1" (+5 volts dc), and with switch S1 closed, that +5 volts dc will be seen on the output 41. It will strengthened slightly by the 1 meg ohm bias resistor R18.

For the case of input A being "1", the output of NAND gate 72 is a "0" or 0 volts dc and a voltage divider network is formed between 1 meg ohm resistor R18 and 10K ohm resistor R1. Since 10K is only 1% of 1 meg, the output will be +0.05 volts dc, essentially a "0" as seen by the computer logic circuits. In fact, extraneous signal noise on the lines is usually greater than this voltage and since the circuits do not trip at such a low voltage, a "0" is seen.

For the last two cases where the input D is a "1" with input E a "1", the output again will depend upon input A and 1 meg ohm bias resistor R18. The same analogy is used as demonstrated immediately above and the output is "1" for A being "0", and "0" for A being "1".

Thus it is very apparent that line driver U1 controls the output on bus lines 41–48 when line driver U1 is being driven through its enabling signal. This is so regardless of the state of the dip switches S1–S8 or of the output of NAND gate 72.

However, for the cases where line driver U1 is not being enabled, it has no output and thus no effect on the bus lines 41–48. Therefore, bus lines 41–48 are affected by dip switches S1–S8 it closed, and if open, by the 1 meg ohm bias resistors R11–R18 connected to +5 volts dc. Of course, if the dip switches are closed and line driver U1 not enabled, the condition of the input to the NAND gate, whose output connects to the dip switches, controls the bus lines and thus the outputs of the circuit.

It thus becomes very apparent that control through input line 71 of NAND gate 72 may be utilized to reverse the digital outputs of dip switches S1–S8 at specific times as desired. By such means, additional versatility is given to the dip switches and thus to the designer of computer and other related logic circuits.

Now it is obvious and possibly advantageous to combine a plurality of line drivers driving onto bus lines 41–48 and also a plurality of ganged dip switches connected to the common bus lines. In such case, the bus lines will still read out through the same output line driver U3 as shown in FIG. 1.

Figure 3:
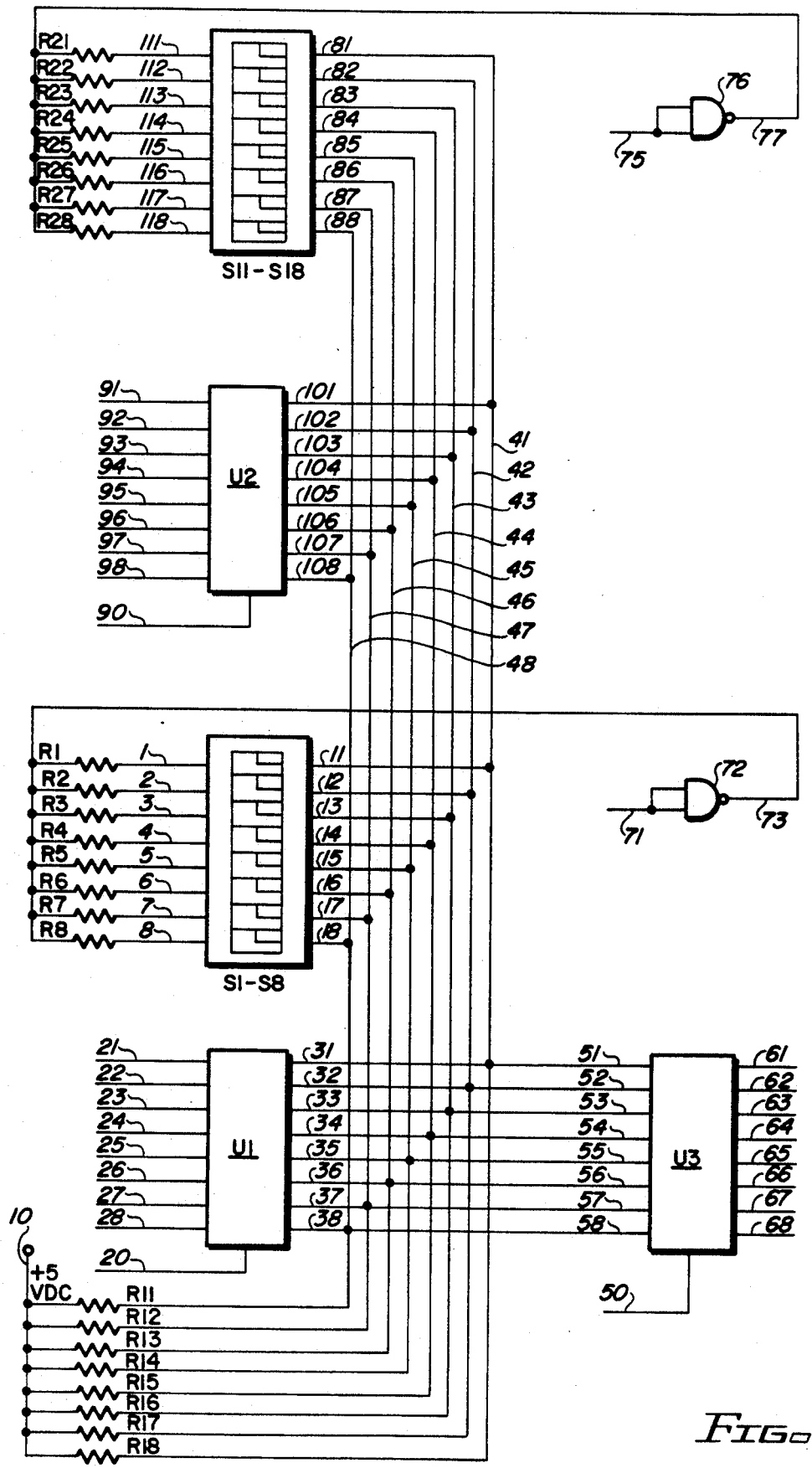
FIG. 3 is a modified block schematic diagram of an alternate embodiment of the invention.

Referring now to FIG. 3, such a schematic block diagram is shown. In FIG. 3, line drivers U1 and U2 are so configured as to both drive onto bus lines 41–48 with individual outputs from each line driver. Two separate ganged dip switches S1–S8 and S11–S18 also have connection onto the bus lines 41–48. Each of these separate ganged dip switches are connected to its own NAND gate. Again the NAND gate has connected inputs to operate as an inverter, always having an output which places a hard "0" or "1" onto one side of the dip switches through a resistor, again nominally 10K ohms.

Receiving the signal information on bus lines 41–48 through its inputs 51–58 is line driver U3, line driver U3 outputting on lines 61–68 what it senses on bus lines 41–48 when instructed to do so by signal on its own enable input 50. As had been previously discussed in connection with FIG. 1, many of the same parameters there existing apply here. Firstly, regardless of the digital signals on the bus lines placed there through the bias resistors R11–R18 connected to +5 volts dc through lead 10, and/or either of the outputs of the dip switches S1–S8 and S11–S18 (when the switches are closed), the output signal of a line driver, when driving, is seen on the bus lines and by the inputs to the receiving line driver U3, regardless of whether that signal is a "0" or "1".

Thus, the same analogy applies to line drivers U1 and U2 as applied to line driver U1 in FIG. 1. It is presumed that line drivers U1 and U2 will never be enabled simultaneously as they could then be driving against each other. In the event that both the dip switches and their connected bias resistors R11–R18 should be placing +5 volts dc on the bus lines, i.e., "1", for a line driver, when driving and outputting a "0", the bus lines will show "0" and all the voltage drops will be across the respective resistors connecting the output of the NAND gate and the bias voltage. The flow of current across these resistors is well within the capabilities of the line drivers to receive and therefore the output of the line driver will prevail on output bus lines.

It is also readily apparent that the output of any one of the dip switches S1-S8 and/or S11-S18 will prevail over the output placed on the bus line through the biasing resistors R1-R18 since the dip switch resistor has such a small value when compared with the biasing resistor. The biasing resistors R11-R18 place a digital "1" on bus lines 41-48 only in the absence of an opposite digital signal from the dip switches and/or line drivers. For an absence of a signal from a dip switch, the dip switch must be open. If the dip switch is closed, the signal received from the NAND gate will be seen on the bus line absent outputs from the line drivers.

It is readily apparent that there is at least one opportunity for potential problems in using a plurality of dip switches feeding onto the bus lines. That is when two closed dip switches feed onto the same bus line and the outputs of each dip switch are different. For example, should dip switch S11 be feeding a digital "1" onto bus line 41 by its output line 81 and dip switch S1 be feeding a digital "0" onto the same bus line 41, then bus line 41 will take on a voltage which is midway between the two voltages, i.e., +2.5 volts dc. Now that voltage will be raised by a very slight amount due to the effect of biasing resistor R18 connected to +5 volts dc, however, that voltage effect in most likelihood will not be measurable. In any event, the net effect upon the input to line driver U3 will depend upon the threshold voltage required by line driver U3 in order to output +5 volts dc, a digital "1". If the threshold input voltage to line driver U3 is 2.5 volts or greater, line driver U3 when enabled will output +5 volts dc. If the input threshold voltage needs be greater than 2.5 volts dc, then line driver U3, when enabled will output 0 volts dc, a digital "0".

As a general rule, if the line drivers are TTL (Transistor-Transistor-Logic) devices, such as 74LS245 (made by Signetics), they will trigger on +1.4 volts dc to output +5 volts dc. If the line drivers are CMOS devices, such as TC74HC245 (made by Toshiba), they trigger on +2.5 volts dc. Thus on TTL devices, a 2.5 volt level on the bus line is sufficient for line driver U3 to output a "1" when enabled. If line driver U3 is a CMOS device, the voltage on the bus line is right at the threshold voltage and therefore the output of the line driver is ambiguous and cannot be definitely ascertained.

Accordingly, it is apparent that the circuit designer will have to take into consideration the possible effects of two dip switches acting contrary-wise upon the bus line and in those cases, which particular type of integrated circuit line drivers are best suited for the application.

Thus, it is readily apparent that understanding the conditions under which multiple dip switches and multiple line drivers connect onto bus lines, advantages may be readily ascertained if one or more of the dip switches are connected to the output of a NAND gate which, when pulsed, will change the digital signal which the dip switch, if closed, places on the bus line.

It is realized that there may be instances where the circuit designer has no need to change the input to the dip switches S1-S8 but would like a hard wired digital input to these switches. In this manner, the chosen input is placed onto the bus lines by solely controlling the dip switch position, either closed or open.

Figure 4A:
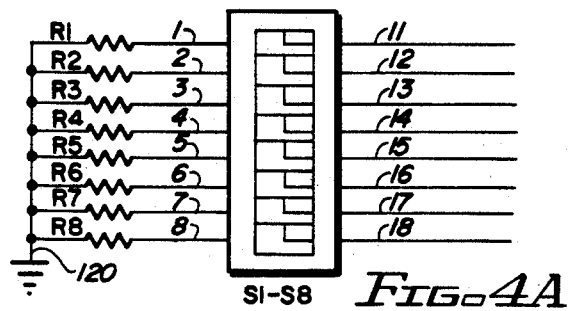
FIGS. 4.A., 4.B., and 4.C. are partial block schematic diagrams of still other alternate embodiments of the invention.
Figure 4B:
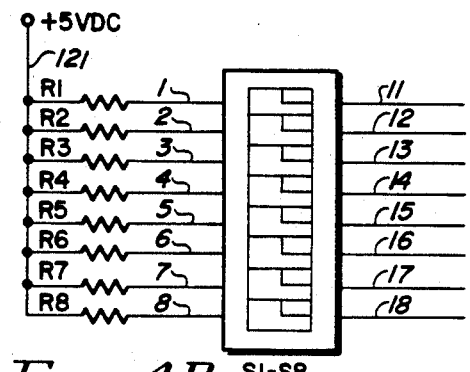
Figure 4C:
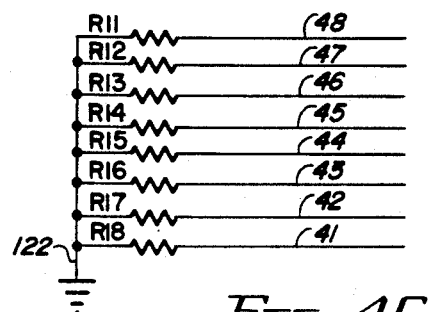

Such embodiments are shown in the FIGS. 4.A. and 4.B. wherein partial schematic block diagrams are shown of the dip switches S1-S8 and their connective respective resistors R1-R8. Here, the output of NAND gate 72 has been removed and in its place connecting resistors R1-R8 is, in FIG. 4.A., a ground connected by lead 120. In this case, with any one of the dip switches S1-S8 closed, a digital "0", or 0 vdc, is fed onto the bus lines 41-48 through respective resistors R1-R8.

Thus, applying the modifications of FIG. 4.A. to the circuit of FIG. 1, a digital "0" is fed onto all the bus lines if the dip switches are closed providing, of course, that line driver U1 is not operating or pulsing. Since R1-R8 are in the preferred embodiment 10K ohms and R11-R18 are 1 meg ohms, a voltage divider network is set up with the voltage on the bus line being just barely above 0 volts. As far as the inputs to line driver U3 are concerned, they will see only a digital "0".

The opposite situation to the alternate embodiment shown in FIG. 4.A. is seen in the alternate embodiment shown in FIG. 4.B. wherein the ground of FIG. 4.A. has been removed and the input to the resistors R1-R8 has been taken to digital "1", +5 volts dc by lead line 121 connecting to +5 volts dc. Here, like the example given in FIG. 4.A., a digital "1" is seen on the bus lines through all closed dip switches of FIG. 1 subject, however, to a different signal emanating from line driver U1 when pulsed or operating. With the pull-up resistors R11-R18 connected to +5 volts dc, there is no voltage division and absent contrary output signals from line driver U1, the inputs to line driver U3 will be a digital "1".

Lastly, FIG. 4.C. shows a further alternate embodiment wherein the pull-up resistors R11-R18 are no longer connected to the voltage representative of a digital "1" but, have in fact been grounded through lead 122. Now, absent any contrary signal emanating from the dip switches S1-S8 or line driver U1, a digital "0" is placed upon all inputs of the output line driver U3. Here again, it is remembered that a digital "1", or +5 volts dc, from either the dip switches S1-S8 or line driver U1 will completely override the digital "0" provided via resistors R11-R18. In the case that a digital "1" is outputted from any one or more dip switches S1-S8 or line driver U1, the full voltage difference, +5 volts dc, will appear across the particular resistor R11-R18 involved. Since this resistor is nominally 1 meg ohm, 5 micro amps current will flow, current easily provided through the dip switches or by the line driver.

It is reminded that the combinations of modifications to the circuits shown in FIGS. 4.A.-4.C. may be alternated such that, for example, the embodiment of FIG. 4.C. could be utilized with the circuit of FIG. 1 still employing NAND gate 72. Similarly, with the modifications of FIG. 4.A., the modification of FIG. 4.C. could be utilized. Similarly, the modifications of FIG. 4.B. and FIG. 4.C may be combined. Thus, all combinations could be obtained. Of course, the alternate embodiments shown in FIGS. 4.A. and 4.B. cannot be utilized with the circuit of FIG. 1 unless NAND gate 72 is removed.

While a preferred embodiment of the invention together with alternate embodiments of the invention have been shown and described, it is appreciated that other such embodiments of the invention are possible and that there is no intent to limit the invention by such disclosure, but rather it is intended to cover all modifications and alternate embodiments falling within the spirit and the scope of the invention as defined within the appended claims.

I claim:

1. In an electronic digital logic circuit having bus lines to which are operably attached associated digital logic elements to transmit digital logic signals onto the bus lines and to remove digital logic signals from the bus lines, an improvement placing a digital logic signal onto a bus line at a selected time, said improvement comprising:

at least one dip switch operably connected to at least one bus line, said dip switch having a selectable open position and closed position;

a digital logic element operably attached to said dip switch, said digital logic element outputting a digital logic signal at a selected time to said dip switch;

a current limiting resistor interposed said dip switch and said digital logic element; and a source of constant digital logic signal operably attached to the bus line, and a bias resistor interposed said source of constant digital logic signal and the bus line, said source of constant digital logic signal outputting a digital logic bias signal onto the bus line, said dip switch passing said time selected digital logic signal when said dip switch is in said closed position onto the bus line, said time selected digital logic signal prevailing over said digital logic bias signal, said time selected digital logic signal thereby present for removal by the associated digital logic elements.

2. The improvement to an electronic digital logic circuit as defined in claim 1 wherein said bias resistor is of a magnitude greater than said current limiting resistor whereby when said dip switch is in said closed position, said time selected digital logic signal outputted by said digital logic elements prevails over said digital logic bias signal outputted from said source of constant digital logic signal when the signals differ, and said digital logic bias signal outputted from said source of constant digital logic signal prevails when said dip switch is in said open position.

3. The improvement to an electronic digital logic circuit as defined in claim 2 wherein the associated digital logic elements which transmit digital logic signals onto the bus lines have a low output impedance, and said current limiting resistor is of a magnitude greater than the output impedance of the associated digital logic elements whereby the digital logic signal transmitted onto the bus line by the associated digital logic elements prevails over both said time selected digital logic signal outputted by said digital logic element and said digital logic bias signal outputted from said source of constant digital logic signal when the signals differ.

4. The improvement to an electronic digital logic circuit as defined in claim 3 wherein said digital logic element operably attached to said dip switch comprises a NAND gate having a pair of inputs and an output, said output operably attached to said dip switch, and said inputs are connected together to receive an associated time selected digital logic signal whereby said NAND gate acts as an inverter to transmit said time selected digital logic circuit signal to said dip switch.

5. In an electronic digital logic circuit having bus lines to which are operably attached associated digital logic elements to transmit digital logic signals onto the bus lines and to remove digital logic signals from the bus lines, an improvement placing a digital logic signal onto a bus line at a selected time, said improvement comprising:

at least one dip switch operably connected to at least one bus line, said dip switch having a selectable open position and closed position;

a first source of constant digital logic signal operably attached to said dip switch, and a current limiting resistor interposed said dip switch and said first source of constant digital logic; and a second source of constant digital logic signal operably attached to the bus line, and a bias resistor interposed said second source of constant digital logic signal and the bus line, said second source of constant digital logic signal outputting a digital logic bias signal onto the bus line, said dip switch passing said digital logic signal when said dip switch is in said closed position from said first source of constant digital logic onto the bus line, said first digital logic signal prevailing over said digital logic bias signal, said first digital logic signal thereby present for removal by the associated digital logic elements.

6. The improvement to an electronic digital logic circuit as defined in claim 5 wherein said bias resistor is of a magnitude much greater than said current limiting resistor whereby when said dip switch is in said closed position, said digital logic signal outputted by said first source of constant digital logic signal prevails over said digital logic bias signal when the signals buffer, and said digital logic bias signal prevails when said dip switch is in said open position.

7. The improvement to an electronic digital logic circuit as defined in claim 6 wherein the associated digital logic elements which transmit digital logic signals onto the bus line have a low output impedance, and said current limiting resistor is of a magnitude greater than the output impedance of the associated digital logic elements whereby the digital logic signal transmitted onto the bus line by the associated digital logic elements prevails over both said digital logic signal outputted by said first source of constant digital logic signal and said digital logic bias signal when the signals differ.

8. In an electronic digital logic circuit having a plurality of bus lines to which are operably attached associated digital logic elements to transmit digital logic signals onto the bus lines and to remove digital logic signals from the bus lines, an improvement placing a digital logic signal onto the plurality of bus lines at a selected time, said improvement comprising:

a plurality of dip switches operably connected to the plurality of bus lines, one each of said plurality of dip switches connected to one each of the plurality of bus lines, each of said plurality of dip switches having a selectable open position and closed position;

a digital logic element operably attached to each of said plurality of dip switches, said digital logic element outputting a digital logic signal at a selected time to each of said plurality of dip switches;

a plurality of current limiting resistors interposed said plurality of dip switches and said digital logic element, one each of said plurality of current limiting resistors interposed each of said plurality of dip switches and said digital logic element; and a source of constant digital logic signal operably attached to each of the plurality of bus lines, and a plurality of bias resistors interposed each of the plurality of bus lines and said source of constant digital logic signal, one of said plurality of bias resistors interposed each one of the plurality of bus lines and said source of constant digital logic signal, said source of constant digital logic signal outputting a digital logic bias signal onto each one of the plurality of bus lines, and each of said plurality of dip switches in said closed position passing said time selected digital logic signal to each of the plurality of bus lines, said time selected digital logic signal prevailing over said digital logic bias signal, said time selected digital logic signal thereby present on the affected bus lines for removal by the associated digital logic elements.

9. The improvement to an electronic digital logic circuit as defined in claim 8 wherein each of said plurality of bias resistors is of a magnitude much greater than each of said plurality of said current limiting resistors whereby when each of said plurality of dip switches is in said closed position, said time selected digital logic signal outputted by said digital logic element prevails over said digital logic bias signal outputted from said source of constant digital logic signal when the signals differ, and said digital logic bias signal outputted from said source of constant digital logic signal prevails when each of said plurality of dip switches is in said open position.

10. The improvement to an electronic digital logic circuit as defined in claim 9 wherein the associated digital logic elements which transmit digital logic signals onto the plurality of bus lines have a low output impedance, and each of said plurality of current limiting resistors is of a magnitude greater than the output impedance of the associated digital logic elements whereby the digital logic signal transmitted onto each of the plurality of bus lines by the associated digital logic elements prevails over both said time selected digital logic signal outputted by said digital logic element and said digital logic bias signal outputted from said source of constant digital logic signal when the signals differ.

11. In an electronic digital logic circuit having bus lines to which are operably attached associated digital logic elements to transmit digital logic signals onto the bus lines and to remove digital logic signals from the bus lines, an improvement placing digital logic signals onto a bus line at selected times, said improvement comprising:
a first dip switch operably connected to a first bus line, said first dip switch having a selectable open position and closed position;
a first digital logic element operably attached to said first dip switch, said first digital logic element outputting a first digital logic signal at a first selected time to said first dip switch;
a first current limiting resistor interposed said first dip switch and said first digital logic element;
a second dip switch operably connected to the first bus line, said second dip switch having a selectable open position and closed position;
a second digital logic element operably attached to said second dip switch, said second digital logic element outputting a second digital logic signal at a second selected time to said second dip switch;
a second current limiting resistor interposed said second dip switch and said second digital logic element; and
a source of constant digital logic signal operably attached to the first bus line, and a first bus resistor interposed said source of constant digital logic signal and first bus line, said source of constant digital logic signal outputting a digital logic bias signal onto the first bus line, said first and said second dip switch passing said first and second time selected digital logic signal when said first and second dip switch is in said respective closed position onto the first bus line, both said first and said second time selected digital logic signal prevailing over said digital logic bias signal, said first and said second time selected digital logic signal thereby present for removal by the associated digital logic elements.

12. The improvement to an electronic digital logic circuit as defined in claim 11 wherein said first bias resistor is of a magnitude greater than each said first and second current limiting resistor whereby when said first and second dip switch is in said closed position, said time selected digital logic signal outputted by said digital logic element prevails over said digital logic bias signal outputted from said source of constant digital logic signal when the signals differ, and said digital logic bias signal outputted from said source of constant digital logic signal prevails when both said first and second dip switch is in said open position.

13. The improvement to an electronic digital logic circuit as defined in claim 12 wherein the associated digital logic elements which transmit digital logic signals onto the bus lines have a low output impedance, and said first and second current limiting resistor is of a magnitude greater than the output impedance of the associated digital logic elements whereby the digital logic signals transmitted onto the bus line by the associated digital logic elements prevails over both said first and said second time selected digital logic signal outputted by said first and said second digital logic element and said digital logic bias signal outputted from said source of constant digital logic signal when the signals differ.

* * * * *